(12) United States Patent
Hill et al.

(10) Patent No.: US 10,386,822 B2
(45) Date of Patent: Aug. 20, 2019

(54) SYSTEM FOR RAPID IDENTIFICATION OF SOURCES OF VARIATION IN COMPLEX MANUFACTURING PROCESSES

(71) Applicant: Tibco Software Inc., Palo Alto, CA (US)

(72) Inventors: Thomas Hill, Tulsa, OK (US); Daniel W. Scott, Broken Arrow, OK (US); Vladimir S. Rastunkov, Tulsa, OK (US)

(73) Assignee: TIBCO SOFTWARE INC., Palo Alto, CA (US)

( * ) Notice: Subject to any disclaimer, the term of this patent is extended or adjusted under 35 U.S.C. 154(b) by 371 days.

(21) Appl. No.: 15/237,978

(22) Filed: Aug. 16, 2016

(65) Prior Publication Data

US 2018/0052450 A1    Feb. 22, 2018

(51) Int. Cl.
*G05B 19/418* (2006.01)
*G06F 17/50* (2006.01)
*G06Q 10/06* (2012.01)

(52) U.S. Cl.
CPC ... *G05B 19/4183* (2013.01); *G05B 19/41875* (2013.01); *G06F 17/50* (2013.01); *G06Q 10/0639* (2013.01); *G05B 2219/32194* (2013.01); *Y02P 90/10* (2015.11); *Y02P 90/22* (2015.11); *Y02P 90/265* (2015.11)

(58) Field of Classification Search
CPC ...... G05B 2219/32194; G05B 19/4183; G05B 19/41875; G06F 17/50; G06Q 50/04
See application file for complete search history.

(56) References Cited

U.S. PATENT DOCUMENTS

2005/0143853 A1* 6/2005 Akimori ............... G06Q 10/06
 700/121
2013/0103174 A1* 4/2013 Stahley ................. G06F 17/00
 700/97

OTHER PUBLICATIONS

Searle, S.R. et al., An Overview of Variance Component Estimation, Apr. 1994 https://ecommons.cornell.edu/bitstream/handle/1813/31816/BU-1231-M.pdf; isessionid=466ECEA15D5B0C70C2258A7D05AD05CA?sequence=1.
Mahamunulu, D.M., Sampling Variances of the Estimates of Variance Components in the Unbalanced 3-way Nested Classification, The Annals of Mathematical Statistics, vol. 34, No. 2 (Jun. 1963), pp. 521-527, https://projecteuclid.org/download/pdf_1/euclid.aoms/1177704163.

(Continued)

*Primary Examiner* — Yasser A Abdelaziez
(74) *Attorney, Agent, or Firm* — McGuireWoods LLP

(57) ABSTRACT

A system, method, and computer-readable medium are disclosed for identifying sources of variation in complex manufacturing processes via a variation identification operation. In certain embodiments, the variation identification operation is performed via a variation identification system. The variation identification operation addresses special class of analytic problems, namely the estimation of variance components and related statistics from very large (big data) hierarchically nested designs of random factors. These types of data structures occur frequently across various industries, and in particular in automated and batch manufacturing where the variability in product quality as measured in final product testing should be related to batches, lots, wafers, suppliers, etc. upstream of the process.

18 Claims, 6 Drawing Sheets

(56) References Cited

OTHER PUBLICATIONS

Measurement Systems Analysis Reference Manual, 4th Edition, 2010 http://www.rubymetrology.com/add_help_doc/MSA_Reference_Manual_4th_Edition.pdf.
George R. Butler et al., U.S. Appl. No. 14/826,770, filed Aug. 14, 2015, entitled Method for Performing In-Database Distributed Advanced Predictive Analytics Modeling via Common Queries.
Vladimir S. Rastunkov et al., U.S. Appl. No. 15/067,643, filed Mar. 11, 2016, entitled Auto Query Construction for In-Database Predictive Analytics.
Duncan, Acheson J., Quality Control and Industrial Statistics, 5th Edition, 1986, Section 3.1, Chapter 31 (Analyses Associated with Analysis of Variances), pp. 765-788.
Milliken, George A. et al., Analysis of Messy Data: vol. I, Designed Experiments, 1992, Chapter 22 (Analysis of Mixed Models) and Chapter 23 (Two Case Studies of a Mixed Model), pp. 274-295.

* cited by examiner

SYSTEM FOR RAPID IDENTIFICATION OF SOURCES OF VARIATION IN COMPLEX MANUFACTURING PROCESSES

BACKGROUND OF THE INVENTION

Field of the Invention

The present invention relates to information handling systems. More specifically, embodiments of the invention relate to identifying sources of variation in complex manufacturing processes.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems to collect and store large amounts of data. Many technologies are being developed to process large data sets (often referred to as "big data," and defined as an amount of data that is larger than what can be copied in its entirety from the storage location to another computing device for processing within time limits acceptable for timely operation of an application using the data).

In-database predictive analytics have become increasingly relevant and important to address big-data analytic problems. When the amount of data that need be processed to perform the computations required to fit a predictive model become so large that it is too time-consuming to move the data to the analytic processor or server, then the computations must be moved to the data, i.e., to the data storage server and database.

An example of a technology area where predictive analytics is important is with manufacturing applications. It can often be challenging with complex manufacturing applications (i.e., manufacturing applications involving many (e.g., more than 1000) discrete and/or interconnected steps) to estimate the components of variability in the final product quality attributable to factors observed or set during manufacturing. An example of a complex manufacturing application where it is desirable to estimate components of variability in a final product is the manufacture of semiconductors. There are a plurality of known tools for statistical analysis of manufacturing data including the Minitab statistical analysis tool, the statistical package for social sciences (SPSS) statistical analysis tool, the JMP statistical analysis tool, the statistical analysis system (SAS), the R Foundation statistical analysis tool, as well as the Statistica Analytics Platform available from Dell, Inc. Many of these known tools include options for estimating components of variance for various applications (e.g., measurement analysis, process capability, etc.). In general, these tools provide known techniques for estimating random-effects and components-of-variance. However, these available methods often do not scale to accommodate very-high dimensional nature of data as they are increasingly common in automated manufacturing.

For example, in semiconductor manufacturing individual chips (often referred to as dies) are grouped onto wafers (which are often circular) containing multiple dies, and multiple wafers are stacked into lots; lots are then moved through hundreds of processing steps automatically executed through various tools. As a result certain specific combinations of tools are applied to all dies (chips) within wafers grouped into the same lot, and the variability between quality measurements assessed at the die (chip) level is the result of variability between dies (within wafers and lots), between wafers (within lots), and between lots. Thus, in such applications there are potentially tens of thousands of individual classes (e.g., dies, within wafers, within lots) that should be included in the estimation of components and sources of variability simultaneously and quickly (i.e., fast enough for the analysis to be relevant to the user).

SUMMARY OF THE INVENTION

A system, method, and computer-readable medium are disclosed for identifying sources of variation in complex manufacturing processes via a variation identification operation. In certain embodiments, the variation identification operation is performed via a variation identification system. The variation identification operation addresses a special class of analytic problems, namely the estimation of variance components and related statistics from very large (big data) hierarchically nested designs of random factors. These types of data structures occur frequently across various industries, and in particular in automated and batch manufacturing where the variability in product quality as measured in final product testing is related to factors affecting batches, lots, wafers, suppliers, etc. upstream of the process.

In certain embodiments, the variation identification operation uses closed-form operations to rapidly estimate variance components into an analytics system for manufacturing support. In certain embodiments, the variation identification operation incorporates closed-form operations into pre-arranged sets of analytic templates. In certain embodiments, the variation identification operation leverages in-database computations in big data environments to compute the aggregates on which the final estimation computations are based. Leveraging in-database computations allows the variation identification operation to operate rapidly on even extremely large hierarchically nested designs of random factors as they frequently occur in semiconductor manufacturing and elsewhere.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
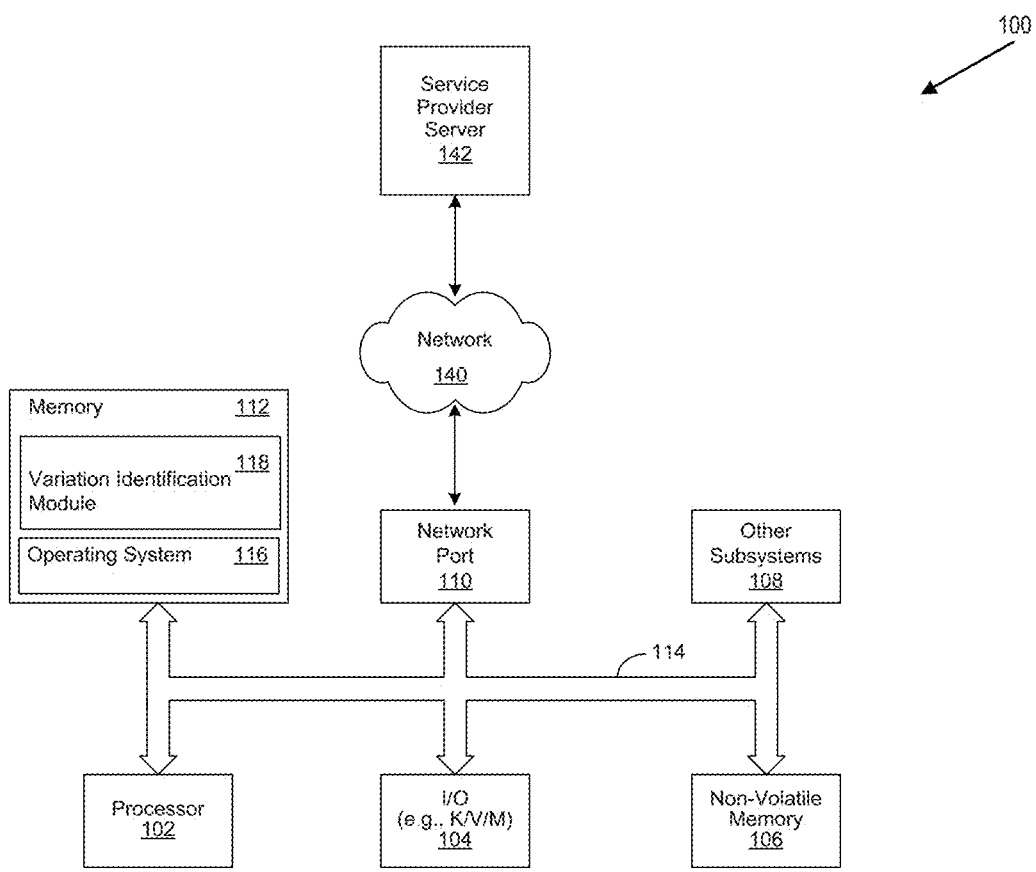
FIG. 1 shows a general illustration of components of an information handling system as implemented in the system and method of the present invention.

Aspects of the present disclosure include a recognition that data from the complex manufacturing process are often hierarchically nested into multiple levels. Aspects of the disclosure include a recognition that the hierarchical nesting results from the application of various steps of a manufacturing process flow to multiple batches or groups of the final product (e.g., dies, nested in wafers, nested in lots).

Aspects of the disclosure include a recognition that complex manufacturing process can be present in semiconductor manufacturing, process manufacturing in the pharmaceutical industry, or other multi step automated manufacturing. For example, a typical process in semiconductor manufacturing includes lots (batches) of wafers, each containing large numbers of dies or chips that are processed through numerous steps to create the final circuitry for individual chip (within each wafer, within each lot). Final quality is determined at the die or chip level, where tests are performed to verify the integrity of the final product. In this example, the final quality measurement data are typically organized by chips (also referred to as a dies) within wafer, and wafers within lots, i.e., the data structure naturally assumes a 3-way hierarchically nested experimental design (Chips-within-Wafers, Wafers-within-Lots). The overall quality of the manufacturing process can be summarized by the overall observed variability (e.g., in failure rates for specific tests) between chips, which originates from differences between lots and differences between wafers. For process optimization purposes, it is important to understand the components (sources) of variance (variability), to be able to trace an issue back to the Lot level, Wafer level, or Chip level. Depending on the sources of the variability observed in the chips, different root causes and corrective actions typically need to be taken.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise variation identification module 118.

The variation identification module 118 performs a variation identification operation which identifies sources of variation in complex manufacturing processes. In certain embodiments, the variation identification operation is performed via a variation identification system. The variation identification operation addresses special class of analytic problems, namely the estimation of variance components and related statistics from very large (big data) hierarchically nested designs of random factors. These types of data structures occur frequently across various industries, and in particular in automated and batch manufacturing where the variability in product quality as measured in final product testing should be related to batches, lots, wafers, suppliers, etc. upstream of the process.

In certain embodiments, the variation identification operation uses closed-form formulas to rapidly (i.e., via a single pass) estimate variance components into an analytics system for manufacturing support. For the purposes of this disclosure, a closed-form formula may be defined as a formula which can be expressed as a set of elementary functions (e.g., summation, subtraction, multiplication, division, raising to power, exponentiation, etc.) which are performed as a single pass on the raw data. More specifically, in certain embodiments, while many methods for estimating variance components are based on statistical algorithms that iteratively maximize the likelihood of the data given parameter estimates for the variance components, the closed-form formulas used in the variation identification operation can be expressed as a set of elementary functions (e.g. summation, subtraction, multiplication, division, raising to power, exponentiation, etc.) that can be computed rapidly and without performing multiple iterations over very large data matrices. This is useful and satisfies typical requirements in automated manufacturing where final product items (e.g., chips within wafers within lots) are rapidly manufactured, and where it is important to gain insight quickly into the root causes of variability in product quality in order to reduce final product defects, waste, and rework. For this purpose, statistical estimation procedures as widely implemented in statistical software, which rely on iterative maximum Likelihood estimation of variance components, are not practical or even possible, because often tens or hundreds of thousands of combinations of, for example, wafers, lots and dies need to be evaluated in a single analysis. For those applications maximum Likelihood methods are either not suitable, or often take too long to produce results given the time constraints regarding opportunities for correcting an ongoing automatic manufacturing process for improved quality. In general, the faster the sources of variability in final product quality can be identified the greater the opportunity to correct quality problems in the ongoing automatic manufacturing process.

In certain embodiments, the variation identification operation incorporates closed-form operations into pre-arranged sets of analytic templates. In certain embodiments, the variation identification operation leverages in-database computations in big data environments to compute the aggregates on which the final estimation computations are based. Leveraging in-database computations allows the variation identification operation to operate rapidly on even extremely large hierarchically nested designs of random factors as they frequently occur in semiconductor manufacturing and elsewhere.

In certain embodiments, the data from the complex manufacturing process are hierarchically nested into multiple levels. In certain embodiments, the hierarchical nesting results from the application of various steps of a manufacturing process flow to multiple batches or groups of the final product (e.g., dies, nested in wafers, nested in lots). In certain embodiments, the complex manufacturing process corresponds to semiconductor manufacturing, process manufacturing in the pharmaceutical industry, or other multi step automated manufacturing.

For example, a typical process in semiconductor manufacturing includes lots (batches) of wafers, each containing large numbers of dies or chips that are processed through numerous steps to create the final circuitry for individual chip (within each wafer, within each lot). Final quality is determined at the die or chip level, where tests are performed to verify the integrity of the final product. In this example, the final quality measurement data are typically organized by chips (also referred to as a die) within wafer, and wafers within lots, i.e., the data structure naturally assumes a 3-way hierarchically nested experimental design (Chips-within-Wafers, Wafers-within-Lots). The overall quality of the manufacturing process can be summarized by the overall observed variability (e.g., in failure rates for specific tests) between chips, which originates from differences between lots and differences between wafers. For process optimization purposes, it is important to understand the components (sources) of variance (variability), to be able to trace an issue back to the Lot level, Wafer level, or Chip level. Depending on the sources of the variability observed in the chips, different root causes and corrective actions typically need to be taken.

Figure 2:
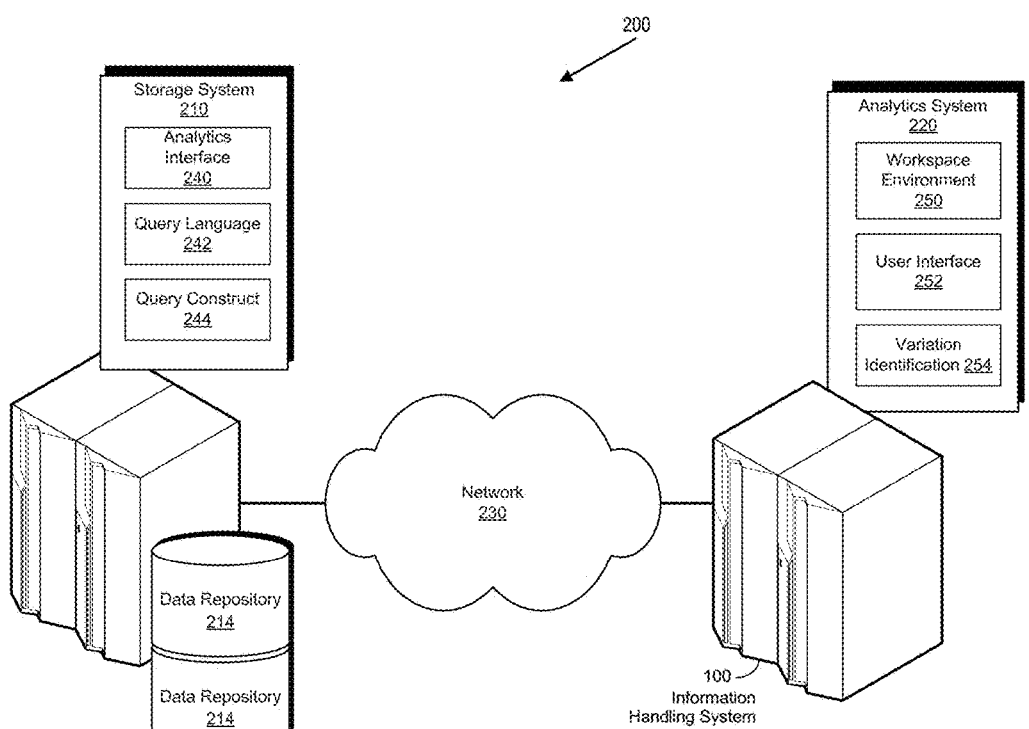
FIG. 2 shows a block diagram of an environment for variation identification.

FIG. 2 shows a simplified block diagram of a distributed analytics environment 200 for performing variation identification operations in accordance with an embodiment of the invention. More specifically, the distributed analytics environment 200 includes a storage system 210 which includes one or more data repositories 214. The distributed analytics environment 200 further includes an analytics system 220 which is coupled with the storage system 210 via a network 230, which may be a private network, a public network, a local or wide area network, the Internet, combinations of the same, or the like. In various embodiments, the network 140 is included within the network 230. Either or both the storage system 210 and the analytics system 220 may reside within and execute on an information handling system 100. Portions of the storage system 210 as well as the analytics system 220 provide a query construction system, an in-database feature selection system and/or a distributed analytics system. Some or all of the functions of a variation identification system and/or the distributed analytics system may be performed via the variation identification module 118, respectively.

The storage system 210 is configured to perform distributed computations to derive suitable aggregate summary statistics, such as summations, multiplications, and derivation of new variables via formulae. In various embodiments, the storage system 210 comprises a SQL Server, an Oracle type storage system, an Apache Hive type storage system, an Apache Spark type storage system and/or a Teradata Server. It will be appreciated that other database platforms and systems are within the scope of the invention. It will also be appreciated that the storage system can comprise a plurality of databases which may or may not be the same type of database.

The storage system 210 includes an analytics interface 240. The storage system 210 further includes a query construction system 244. The storage system 210 executes a query language 242. The query language 242 enables the storage system 210 to initiate and control the execution of variation identification computations and aggregations in-database. In certain embodiments, the query language 242 is included within the analytics interface 240. In various embodiments, the query language 242 is defined by the type of storage system used and typically corresponds to one of the dialects of the SQL.

The analytics system 220 performs statistical and mathematical computations. In certain embodiments, the analytics system 220 comprises a Statistica Analytics Platform available from Dell, Inc. The analytics system 220 comprises a workspace environment 250, user interfaces 252 for combining aggregate statistics and numerical summaries computed by the Storage System 210 and a variation identification system 254. Queries are constructed on the analytics system 220 as designed on the user interface 252 and are executed on the storage system 210. In certain embodiments, the storage system 210 may include a query optimization layer (not shown). The variation identification system 254 generates in-database queries for execution by the query language 242 when performing variation identification from complex manufacturing system data. The analytics system 220 further performs mathematical and statistical computations to derive final predictive models. In certain embodiments, the Statistica Analytics Platform available from Dell, Inc. and the Graphical User Interface of the Statistica Analytics Platform are examples of the workspace environment 250 and user interfaces 252, respectively.

The workspace environment 250 provides summaries and aggregates which are computed via common queries, executed through the storage system 210, and executed via distributed query execution enabled through the capabilities of the storage system 210. For some algorithms, the execution performed on the Storage System 210 is initiated via derived variables defined through queries (e.g., coded design matrices), sums, sums of squared values, sums of squared cross-products of values, weights, numbers of observations, and other aggregate values. Additionally, in certain embodiments, the results of the execution performed on the storage system 210 are then further processed by the workspace environment 250 on the analytics system 220 to compute predictive models via multiple linear regression, general linear models, general logistic regression models, principal components analysis, cluster analyses, recursive partitioning (tree) models, and others.

Additionally, in certain embodiments, the execution performed on the storage system 210 includes performing certain computations and then creating subsamples of the results of the execution on the storage system 210. These subsamples are accessed by the workspace environment via queries subsamples of all data. The analytics system 220 can then operate on subsamples to compute (iteratively, e.g., over consecutive samples) final predictive models. Additionally, in certain embodiments, the subsamples are further processed by the workspace environment 250 on the analytics system 220 to compute predictive models including recursive partitioning models (trees, boosted trees, random forests), support vector machines, neural networks, and others.

In this process, consecutive samples may be samples relating to complex manufacturing processes, random samples extracted at the storage system 210, or samples of consecutive observations returned by queries executing in the storage system 210. The analytics system 220 computes and refines desired coefficients for predictive models from consecutively returned samples, until the computations of consecutive samples no longer lead to modifications of those coefficients. In this manner, not all data in the storage system 210 ever needs to be processed.

The user interface 252 of the analytics system 220 provides user interface options to parameterize and optimize the computations. For example, in certain embodiments options are provided to enable variation identification from data subsets extracted from the storage system 210, to derive best initial parameter estimates for any of the prediction models. The SQL query-based operation is then used to refine and finalize the model parameters. The user interface 252 also interacts with the variation identification system 254 to provide variation identification user interfaces. The variation identification user interfaces facilitate construction of queries for in database predictive analytics, especially for variation identification from complex manufacturing processes.

Accordingly, the distributed analytics environment 200 enables variation identification analytics to be performed in a platform-agnostic fashion. Regardless of the actual data storage system, the analytics system 220 is able to leverage all capabilities of the Storage System for distributed processing, to perform the data-processing-intensive operations of computing aggregates or samples.

The variation identification system 254 provides efficient in-database computations for variation identification. The analytics system 220 provides user and automation interfaces. The storage system 210 stores data on which the in-database computations are performed. In certain embodiments, the storage system 210 includes an ability to execute SQL or SQL-like queries to compute simple summaries for selected data fields, or selected portions of data fields. In certain embodiments, the simple summaries include for example counts, sums, averages and standard deviations. In certain embodiments the selected data fields or selected portions of data fields are defined by statements such as Select, Where and Group By statements.

In certain embodiments, the user interface 252 of the analytics system 220 presents an automation interface. In certain embodiments, the automation interface enables users to automatically perform variation identification operations.

The distributed analytics environment 200 is implemented, without requiring deployment of storage system specific agents or computer code, against many different data storage systems, including all standard databases, Hadoop type storage systems or Spark via Hive (and HiveQL), or to emerging appliances such as Microsoft APS. The analytics system 220 and workspace environment 250 are agnostic with respect to the actual storage systems in use, and hence capable of supporting hybrid environments. Such a distributed analytics system would be much easier to deploy, maintain, and scale.

In various embodiments, the network 230 may be a public network, such as the Internet, a physical private network, a virtual private network (VPN), a wireless network, or any combination thereof. In certain embodiments, the wireless network may be a personal area network (PAN), based on technologies such as Bluetooth or Ultra Wideband (UWB). In various embodiments, the wireless network may include a wireless local area network (WLAN), based on variations of the IEEE 802.11 specification, often referred to as WiFi. In certain embodiments, the wireless network may include a wireless wide area network (WWAN) based on an industry standard including two and a half generation (2.5G) wireless technologies such as global system for mobile communications (GPRS) and enhanced data rates for GSM evolution (EDGE). In various embodiments, the wireless network may include WWANs based on existing third generation (3G) wireless technologies including universal mobile telecommunications system (UMTS) and wideband code division multiple access (W-CDMA).

A variation identification operation is desirable when performing analysis on automated manufacturing data such as those that arise in the manufacture of semiconductor chips can also occur in various other manufacturing environments, including batch manufacturing where raw materials from different suppliers are incorporated into different batches of product, and final product quality is determined based on measurements applied to final individual product (within batch, within supplier). In that case, understanding the sources of variability (components of variance) of the final product quality (e.g., whether the variance can be attributed to differences in suppliers or differences in batches) can critically affect root cause analyses and process optimization efforts.

A variation identification operation is also desirable when performing analysis on streaming data. Identifying variations in streaming data such as data that occur in Internet of Things (IoT) applications can also be desirable. For example, electricity-usage data collected at the household level can be analyzed hour-by-hour (hour-of-the-day), within household, within day-of-the-week, and so on, again giving rise to a hierarchically nested data structure. For power planning purposes, it can be of interest to understand the contribution to the variability in power usage attributable to variability between the hours-of-the-day, the households, and the days-of-the-week.

In these examples, a fundamental analytic challenge arises from the sizes of the hierarchical nested design structure that occur in real-world applications and problems. For example, in semiconductor manufacturing, it is not uncommon that hundreds of dies (chips) are nested within each wafer, and that hundreds of wafers are nested within hundreds of lots, thus given rise to nested analysis of variance (ANOVA) designs with data for tens or hundreds of thousands of individual (nested) levels. Such large amounts of data far exceed the capabilities of known ANOVA analysis software for estimating components of variance. Additionally, in many manufacturing applications, the data are frequently stored in a semi-structured (or noSQL) database, representing big data repositories and allowing for flexible format changes as the production processes evolve. Data sizes often exceed the limits of what can reasonably be extracted and transferred to a computation server to perform variance estimation. Instead, to support practical applications where results are generated within reasonable time intervals (i.e., time intervals short enough to address the causes of the variation) to support time-critical actions, it is often necessary to bring the computations to the data, i.e., to perform most of the computations within the database in which the data are stored.

For the purposes of the present disclosure the term fixed effects may be defined as factors in an experimental design with levels that are deliberately arranged by the experimenter. For the purposes of the present disclosure, the term random effects may be defined as factors in an experimental design with levels that are not deliberately arranged by the experimenter, but randomly sampled from a large universe of potential levels.

Figure 3:
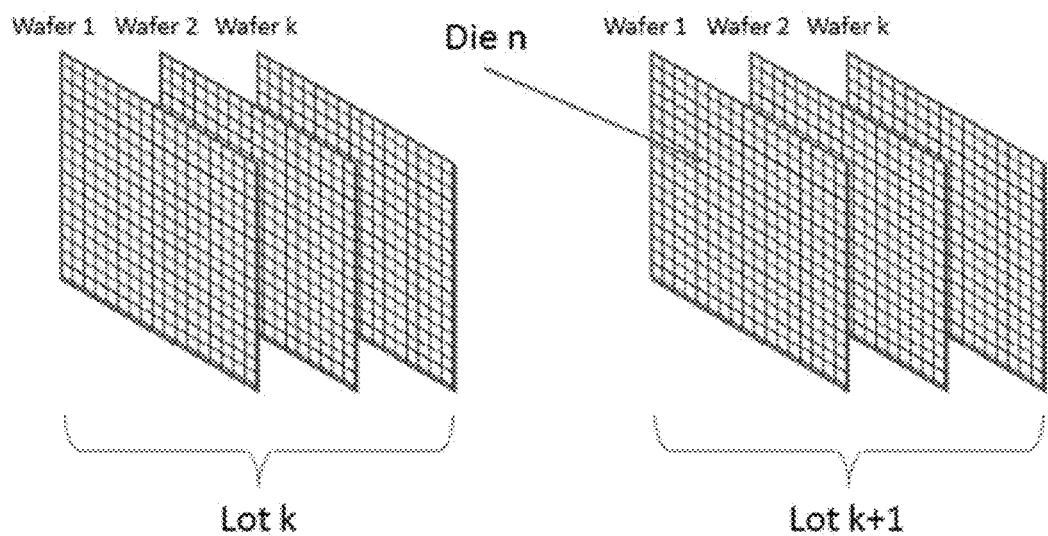
FIG. 3 shows a block diagram showing components of an example semiconductor chip manufacturing process.

Referring to FIG. 3, a block diagram of a typical semiconductor chip manufacturing example resulting in hierarchically nested data that can be analyzed by the variation identification operation is shown. In certain embodiments, random factors may be sampled from a population of possible factor levels. For example, in semiconductor manufacturing, observed Lots can be considered a sample from the universe of possible Lots, observed Wafers can be considered a sample from the universe of possible wafers, and observed Dies can be considered a sample from the universe of possible wafers. Thus, the factors from each of these samples would be "random effects". When replicating a study with random effects, the operation would re-sample from the universe of possible Lots, Wafers, and Dies, i.e., look at a new production run. If the operation were to introduce a factor such as some parameter settings on a machine, which would be either "high" or "low", then that factor would be a fixed effect, because this factor would not be randomly sampled but deliberately set by the experimenter or engineer. Further, when replicating such a study, the same high/low factor settings would be arranged to create identical condition for a replication experiment.

Estimation operations for random effect models are often computationally intensive and can require significant computer resources. Known statistical packages such as the Variance Estimation and Precision Analysis Computations (VEPAC) statistical package available via the Dell Statistica Analytics Platform use iterative maximum likelihood (ML) or Restricted Maximum Likelihood (REML) methods to estimate variance components and their standard errors. However, often these computations do not scale well to large-data or big-data problems, and hence, can require modification for addressing use cases such as performing analysis on automated manufacturing data.

In the present disclosure, the variation identification operation facilitates analysis on automated manufacturing data by computing variance components for hierarchically nested random effect designs such as found in big data. In certain embodiments, core computations of the variation identification operation include a new method for estimating variance components from very large hierarchically nested design, leveraging simplified and in-database computations. This variation identification operation scales to problems with tens and even hundreds of thousands of individual classes (e.g., Dies, within Wafers, within Lots). Accordingly, the variation identification operation is suitable for automated application in various industries such as the previously discussed use cases. Specifically, the variation identification operation leverages closed-form computational formulas for unbalanced nested random effects designs within an automated analytics system to compute variance components. Also, in certain embodiments the variation identification operation is performed, at least in part, using in-database computations for aggregates (e.g., sums, sums of squares).

Figure 4:
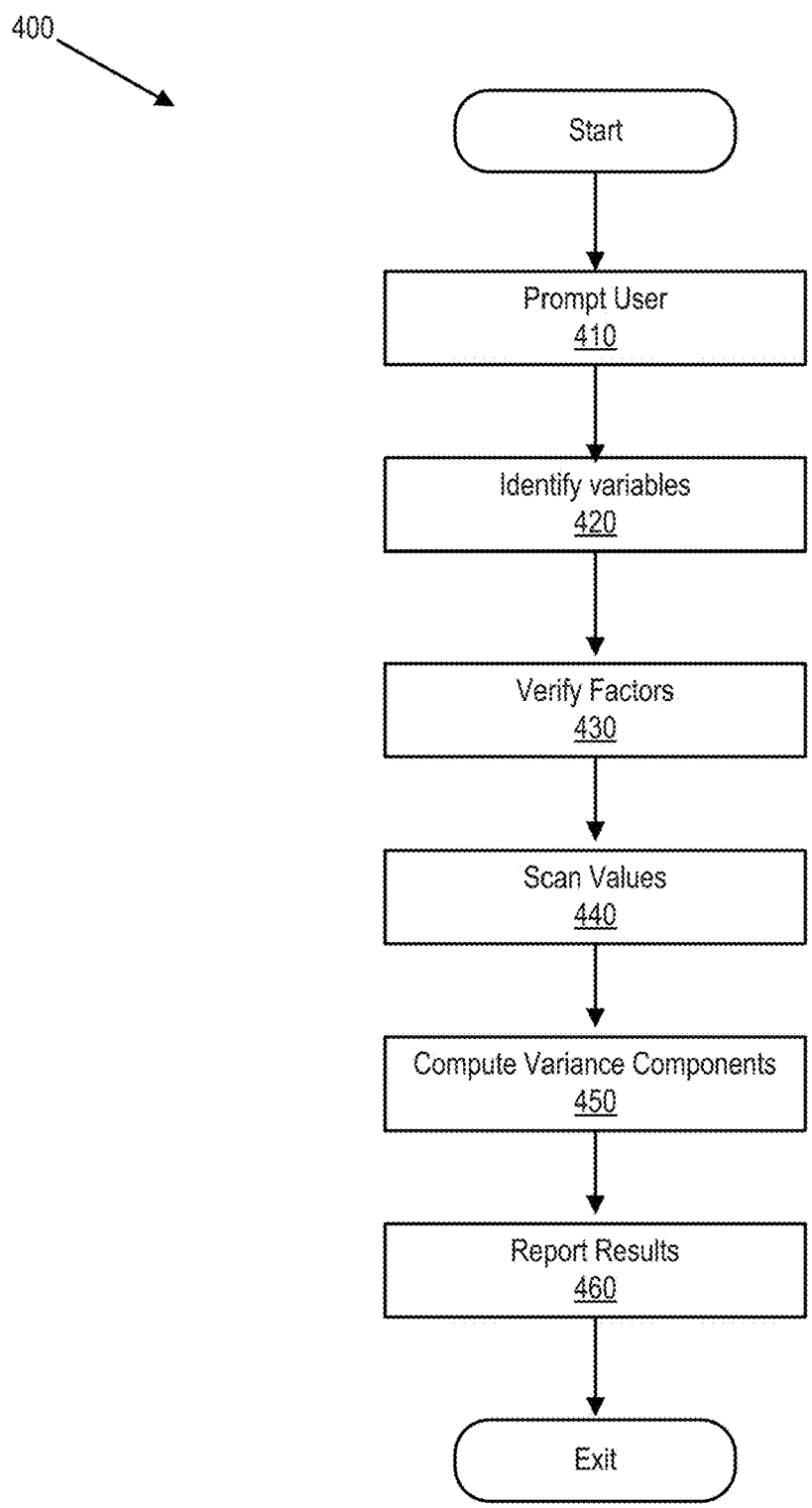
FIG. 4 shows a flow chart of a variation identification operation

Referring to FIG. 4, a flow chart of a variation identification operation 400 is shown. The variation identification operation provides automated variance components estimation in hierarchically nested random effects designs. More specifically, the variation identification operation 400 starts at step 410 with the variation identification system 254 prompting a user to select factors describing a hierarchically nested design. In certain embodiments, the prompting is via a variation identification graphical user interface. For example, the user may be prompted to select the fields that index Lots, Wafers, and Dies from a data repository semiconductor manufacturing information. In certain embodiments, step 410 selection of the factors is automated through programmatic interfaces to a computation server (e.g., Information handling system 100 executing the analytics system 220). Next at step 420, the user is prompted to identify one or more continuous outcome or measurement variables for which the variation identification 254 system will compute variance components (which provide quantifiable product quality measurements).

Next, at step 430, the computation server verifies that the specified factors identify a hierarchically nested design. In certain embodiments, if the design specified through the factors is not a hierarchically nested design, the variable identification operation suggests performance of a Random-Effects ANOVA analysis using common maximum Likelihood estimation methods, if such an analysis is possible given the size of the design. Next, at step 440, the computation server scans all values for the specified factors to identify the unique values for each specified factor. If some or all of the data for the unique values reside on a database server, then the analytics system 220 executes a query to the database server (e.g., storage system 210) to identify the unique factor values.

Next, at step 440, the variable identification operation computes the sums, and sums of squares, and counts of valid (i.e., non-null) numbers of observations for each selected measurement variable. If the data reside on a database server, then these computations can be accomplished via queries inside the database server. Next at step 450 the variable identification operation compute the variance components and related statistics using the closed-form computations based on the sums of valid (i.e., non-null) observations, sums, and sums of squares for each measurement variable.

Next, at step 460, the variable identification operation reports the results of the variable identification operation. In various embodiments, the results can include one or more of the components of variance attributable to each factor, a percent of variability attributable to each factor, relative to the total variability (variance), an estimated variance and standard error of the variance components, estimated covariances between the variance components, a statistical significance test of the estimated variance components, an ANOVA table, and/or a Pareto analysis and charts of all relative and absolute variance components. Next at step 470, the results are used to identify any main sources of variability in the data.

Figure 5:
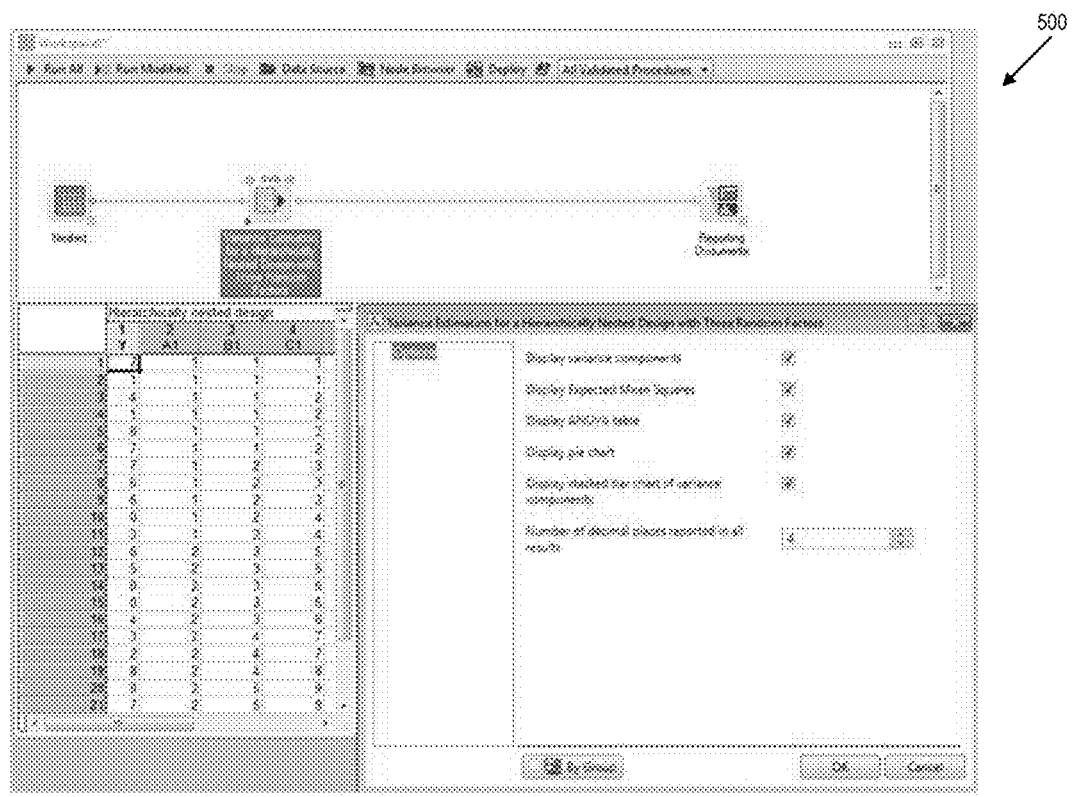
FIG. 5 shows an example screen presentation for a user interface for specification of a variation identification operation.

FIG. 5 shows an example screen presentation for a user interface 500 for specification of a variation identification operation. The user interface 500 provides a user interface to allow specification of the variables used within a variation identification operation to facilitate identification of variations which may have caused issues when performing a complex manufacturing operation.

Figure 6:
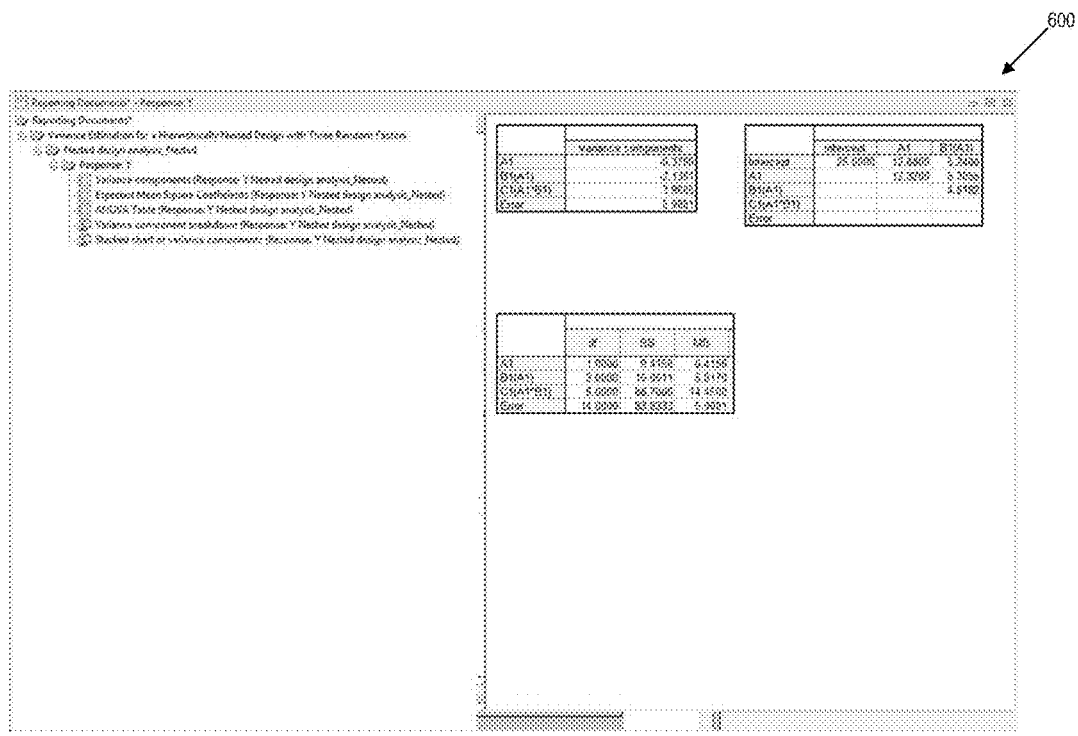
FIG. 6 shows an example screen presentation for a user interface for the results of a variation identification operation.

FIG. 6 shows an example screen presentation for a user interface 600 for the results of a variation identification operation. The user interface 600 provides results of a variation identification operation to enable identification of variations which may have caused issues when performing a complex manufacturing operation.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A computer-implementable method for operating a statistical analysis tool for evaluating component variance of a complex manufacturing operation, comprising:
 presenting a variation identification interface to a user, the variation identification interface enabling a user to select one or more variation components relating to the complex manufacturing operation;
 providing manufacturing data relating to the manufacturing operation to a manufacturing data repository;
 performing closed-form computation operations on the manufacturing data to rapidly identify variance components from the manufacturing data; and,
 identifying sources of variation in complex manufacturing processes;
 wherein the sources of variation identify root causes of variability in product quality.

2. The method of claim 1, further comprising:
 distributing the closed-form operations across a plurality of nodes of the storage system; and,
 executing the closed form operations at each of the plurality of nodes of the storage system.

3. The method of claim 1, wherein:
 the closed-form operations are incorporated into pre-arranged sets of analytic templates.

4. The method of claim 1, wherein:
 the variation identification operation leverages in-database computations in big data environments to compute aggregates on which the final estimation computations are based.

5. The method of claim 1, wherein:
 the manufacturing operation comprises automated and batch manufacturing.

6. The method of claim 5, wherein:
variability in product quality of the manufacturing operation is measured in final product testing upstream of the manufacturing operation.

7. A system for operating a statistical analysis tool for evaluating component variance of a complex manufacturing operation, the system comprising:
a processor;
a data bus coupled to the processor; and
a non-transitory, computer-readable storage medium embodying computer program code, the non-transitory, computer-readable storage medium being coupled to the data bus, the computer program code interacting with a plurality of computer operations and comprising instructions executable by the processor and configured for:
presenting a variation identification interface to a user, the variation identification interface enabling a user to select one or more variation components relating to the complex manufacturing operation;
providing manufacturing data relating to the manufacturing operation to a manufacturing data repository;
performing closed-form computation operations on the manufacturing data to rapidly identify variance components from the manufacturing data; and,
identifying sources of variation in complex manufacturing processes;
wherein the sources of variation identify root causes of variability in product quality.

8. The system of claim 7, wherein the instructions are further configured for:
distributing the closed-form operations across a plurality of nodes of the storage system; and,
executing the closed form operations at each of the plurality of nodes of the storage system.

9. The system of claim 7, wherein:
the closed-form operations are incorporated into pre-arranged sets of analytic templates.

10. The system of claim 7, wherein:
the variation identification operation leverages in-database computations in big data environments to compute aggregates on which the final estimation computations are based.

11. The system of claim 7, wherein:
the manufacturing operation comprises automated and batch manufacturing.

12. The system of claim 11, wherein:
variability in product quality of the manufacturing operation is measured in final product testing upstream of the manufacturing operation.

13. A non-transitory, computer-readable storage medium embodying computer program code for operating a statistical analysis tool for evaluating component variance of a complex manufacturing operation, the computer program code comprising computer executable instructions configured for:
presenting a variation identification interface to a user, the variation identification interface enabling a user to select one or more variation components relating to the complex manufacturing operation;
providing manufacturing data complex relating to the manufacturing operation to a manufacturing data repository;
performing closed-form computation operations on the manufacturing data to rapidly identify variance components from the manufacturing data; and,
identifying sources of variation in complex manufacturing processes;
wherein the sources of variation identify root causes of variability in product quality.

14. The non-transitory, computer-readable storage medium of claim 13, wherein the instructions are further configured for:
distributing the closed-form operations across a plurality of nodes of the storage system; and,
executing the closed form operations at each of the plurality of nodes of the storage system.

15. The non-transitory, computer-readable storage medium of claim 13, wherein:
the closed-form operations are incorporated into pre-arranged sets of analytic templates.

16. The non-transitory, computer-readable storage medium of claim 13, wherein:
the variation identification operation leverages in-database computations in big data environments to compute aggregates on which the final estimation computations are based.

17. The non-transitory, computer-readable storage medium of claim 13, wherein:
the manufacturing operation comprises automated and batch manufacturing.

18. The non-transitory, computer-readable storage medium of claim 17, wherein:
variability in product quality of the manufacturing operation is measured in final product testing upstream of the manufacturing operation.

* * * * *